(12) United States Patent
Yabuki

(10) Patent No.: US 7,259,398 B2
(45) Date of Patent: Aug. 21, 2007

(54) SEMICONDUCTOR LIGHT EMITTING APPARATUS AND METHOD OF FABRICATING THE SAME

(75) Inventor: Yoshifumi Yabuki, Miyagi (JP)

(73) Assignee: Sony Corporation, Tokyo (JP)

( * ) Notice: Subject to any disclaimer, the term of this patent is extended or adjusted under 35 U.S.C. 154(b) by 92 days.

(21) Appl. No.: 10/973,193

(22) Filed: Oct. 26, 2004

(65) Prior Publication Data

US 2005/0087734 A1 Apr. 28, 2005

(30) Foreign Application Priority Data

Oct. 27, 2003 (JP) ............................ P2003-366336

(51) Int. Cl.
*H01L 29/22* (2006.01)
(52) U.S. Cl. ......................... 257/94; 257/79; 257/13; 257/78; 257/85; 257/90; 257/E25.019
(58) Field of Classification Search ...................... None
See application file for complete search history.

(56) References Cited

U.S. PATENT DOCUMENTS 6,608,850 B1 * 8/2003 Inaba ..................... 372/45.01
2004/0195576 A1 * 10/2004 Watanabe et al. ............ 257/79

FOREIGN PATENT DOCUMENTS

JP 05-067849 3/1993

* cited by examiner

*Primary Examiner*—Leonardo Andujar
*Assistant Examiner*—Scott R. Wilson
(74) *Attorney, Agent, or Firm*—Robert J. Depke; Rockey, Depke, Lyons & Kitzinger LLC.

(57) ABSTRACT

A semiconductor light emitting apparatus is proposed, which has thyristor without increasing number of constituent semiconductor layers, with large degree of freedom of selection of ON voltage. It comprises first-conductivity-type first cladding layer, active layer, and second-conductivity-type second cladding layer on substrate; pair of opposing first recesses forming stripe-patterned ridge configuring major current path, and second recess disposed on outer side of one of first recesses on second cladding layer side, each recesses formed to depth keeping active layer unreached; first-conductivity-type current blocking layer formed over inner surfaces of first and second recesses, and second-conductivity-type contact layer formed on current blocking layer; wherein light emitting portion and thyristor structural portion composed of stack of second-conductivity-type contact layer, first-conductivity-type current blocking layer, second-conductivity-type cladding layer, active layer and first-conductivity-type first cladding layer at second recess are formed; and ON voltage of thyristor is adjustable on selection of depth of second recess.

11 Claims, 3 Drawing Sheets

SEMICONDUCTOR LIGHT EMITTING APPARATUS AND METHOD OF FABRICATING THE SAME

CROSS REFERENCE TO RELATED APPLICATION

This application claims priority from Japanese Priority Application No. 2003-366336, filed on Oct. 27, 2003 with the Japanese Patent Office, the entire content of which is hereby incorporated by reference.

BACKGROUND OF THE INVENTION

1. Field of the Invention

The present invention relates to a semiconductor light emitting apparatus having a semiconductor light emitting element such as semiconductor laser, light emitting diode or the like, and a method of fabricating the same, aiming to prevent destruction, such as electrostatic destruction, of the semiconductor light emitting element, and to make a great stride of improvement in the strength against electrostatic destruction.

2. Description of Related Art

Electrostatic destruction, or electrostatic allowance, is an essential issue of semiconductor light emitting apparatus typically having semiconductor laser element. The electrostatic destruction is categorized into that ascribable to short-circuiting of the semiconductor laser per se, and that ascribable to destruction of light emission end face due to instantaneous increase in the emission intensity. Generally speaking, efforts of improving performances of the laser, such as for lower power consumption and higher efficiency, tend to degrade the electrostatic allowance. This is supposed that decrease in the threshold carrier density $J_{th}$ and improvement in the differential quantum efficiency possibly worsen damage on the semiconductor laser even under an equivalent level of static electricity. The above-described end face destruction can be solved by adopting so-called window structure which can moderate concentration of light in the end face structure, wherein general methods adopted for the purpose of avoiding the electrostatic destruction including this sort of destruction and of raising the electrostatic allowance, include use of protection elements such as capacitor, diode, thyristor and so forth, which are externally attached. This, however, results in increase in the cost due to increase in the number of process steps or components for the assembly, and increase in the size.

On the other hand, a proposal has been made on a configuration in which a thyristor composing a protection circuit is fabricated into a substrate composing a semiconductor light emitting element (see, for example, Japanese Patent Application Publication No. HEI5-67849, FIG. 1). However, thus-configured semiconductor light emitting apparatus suffers from a complicated configuration such as having a large number of stacked semiconductor layers, and has only a small degree of freedom on selection of characteristics of the thyristor, because voltage and other characteristics of the thyristor can affect characteristics of the semiconductor light emitting apparatus.

However, for an exemplary case where an active layer of a semiconductor light emitting adopts a multiple quantum well structure, characteristics of the apparatus will vary, which is typified by increase in the ON voltage as compared with that in a single-layer structure, so that it will be necessary to correspondently alter a design value of the ON voltage $V_{on}$ of the thyristor.

SUMMARY OF THE INVENTION

The present invention is to provide a semiconductor light emitting apparatus and a method of fabricating the same, which make it possible to fabricate a thyristor, which is provided for preventing so-called electrostatic destruction, or destruction induced by an accidental over-current, together with a semiconductor light emitting apparatus, without increasing the number of constituent semiconductor layers of a desired semiconductor light emitting element, and without relying upon a special fabrication technique, and moreover, also make it possible to select characteristics such as ON voltage of the thyristor with a large degree of freedom, while giving almost no influence on setting of characteristics of the semiconductor light emitting apparatus.

A semiconductor light emitting apparatus of the present invention is configured as having, on a substrate, at least a first-conductivity-type first cladding layer, an active layer, and a second-conductivity-type second cladding layer; having, on the second cladding layer side, a pair of opposing first recesses forming a stripe-patterned ridge which configures a major current path, and a second recess disposed on the outer side of at least one of the first recesses, each of the first and second recesses being formed to a depth while keeping the active layer unreached; having a first-conductivity-type current blocking layer formed so as to extend over the inner surfaces of the first and second recesses, and a second-conductivity-type contact layer formed on the current blocking layer; wherein a light emitting portion causing light emission by current which flows through the major current path; and a thyristor structural portion composed of a stack of the second-conductivity-type contact layer, the first-conductivity-type current blocking layer, the second-conductivity-type cladding layer, the active layer and the first-conductivity-type first cladding layer at the second recess are formed; and having ON voltage of the thyristor structural portion adjustable depending on selection of depth of the second recess.

In the semiconductor light emitting apparatus of the present invention, the active layer can be configured as having a multiple quantum well (MQW) structure. In the semiconductor light emitting apparatus of the present invention, it is also allowable to form a stripe-patterned boundary ridge between the first recess and the second recess, so as to extend along the stripe-patterned ridge. The ON voltage of the thyristor is specifically adjusted to a low value not affective to operations of the semiconductor light emitting element. Operational voltage of the thyristor after turned on is adjusted to lower than, or equivalent to the operation voltage of the semiconductor light emitting element. Area of the thyristor structural portion is adjusted larger enough than area of the major current path portion.

A method of fabricating a semiconductor light emitting apparatus of the present invention is characterized by having a step of forming, on a substrate by epitaxial growth, at least a first-conductivity-type first cladding layer, an active layer and a second-conductivity-type second cladding layer, composing a semiconductor light emitting element; a step of forming, on the second cladding layer side, a pair of opposing first recesses forming therebetween a stripe-patterned ridge which configures a major current path; a step of forming a second recess on the outer side of at least one of the first recesses; a step of epitaxially growing a first-conductivity-type current blocking layer and a second-conductivity-type contact layer so as to extend over the first and second recesses; a step of forming a recess to a depth across the contact layer and current blocking layer above the ridge to thereby form a thinned portion; and a step of introducing a second-conductivity-type impurity from the side above the contact layer to thereby form, in the thinned portion, a contact portion reaching the second cladding layer of the ridge, wherein a light emitting portion causing light emission by current which flows through the major current path; and a thyristor structural portion composed of a stack of the second-conductivity-type contact layer, the first-conductivity-type current blocking layer, the second-conductivity-type cladding layer, the active layer and the first-conductivity-type first cladding layer at the second recess are formed; and having ON voltage of the thyristor structural portion adjustable depending on selection of depth of the second recess.

According to the above-described semiconductor light emitting apparatus of the present invention, the thyristor based on an alternative stack of the first and second conductivity-type layers is configured in the second recess, using only semiconductor layers composing the semiconductor light emitting element, by forming the second recess on the outer side of the first recesses composing the ridge therebetween, by filling the blocking layer for limitedly forming the current path in the ridge so as to extend over the second recess, and further by forming thereon the contact layer, and thereby the thyristor can be configured as having a PNPQN structure referring now the active layer, adopting a multiple quantum well structure, to as Q. Because the thyristor and semiconductor light emitting element are in an electrically parallel configuration, an appropriate selection of the ON voltage of the thyristor makes it possible to effectively prevent destruction of the semiconductor light emitting element, even if an abnormal voltage is accidentally applied to the semiconductor light emitting element, by preliminarily turning the thyristor on.

The ON voltage $V_{on}$ of the thyristor in the configuration of the present invention is adjustable by the depth of the second recess, and destruction voltage varies depending on the configuration in particular for the case where the active layer adopts a multiple quantum well structure, and this raises a need of an adaptive design of the ON voltage of the thyristor. The configuration of the present invention makes it possible to select the ON voltage through selection of the depth of the second recess, without affecting characteristics of the semiconductor light emitting element per se, while successfully avoiding any need of addition of a specialized semiconductor layer for controlling the ON voltage.

The structure additionally having the boundary ridge between the first and second recesses, that is, the second recess having a ridge-forming groove structure, is more successful in preventing the characteristics of the light emitting element portion from being affected by the thyristor portion, and more specifically, by the thyristor portion during the ON time.

Selection of the area of the thyristor structural portion as larger enough as possible than the area of the major current path portion of the ridge portion makes it possible to allow a larger amount of current to flow through the thyristor when it is turned on, and this further improves electrostatic destruction strength of the semiconductor light emitting element, which is typically semiconductor laser.

Further features of the invention, and the advantages offered thereby, are explained in detail hereinafter, in reference to specific embodiments of the invention illustrated in the accompanying drawings.

DESCRIPTION OF THE PREFERRED EMBODIMENTS

Figure 1:
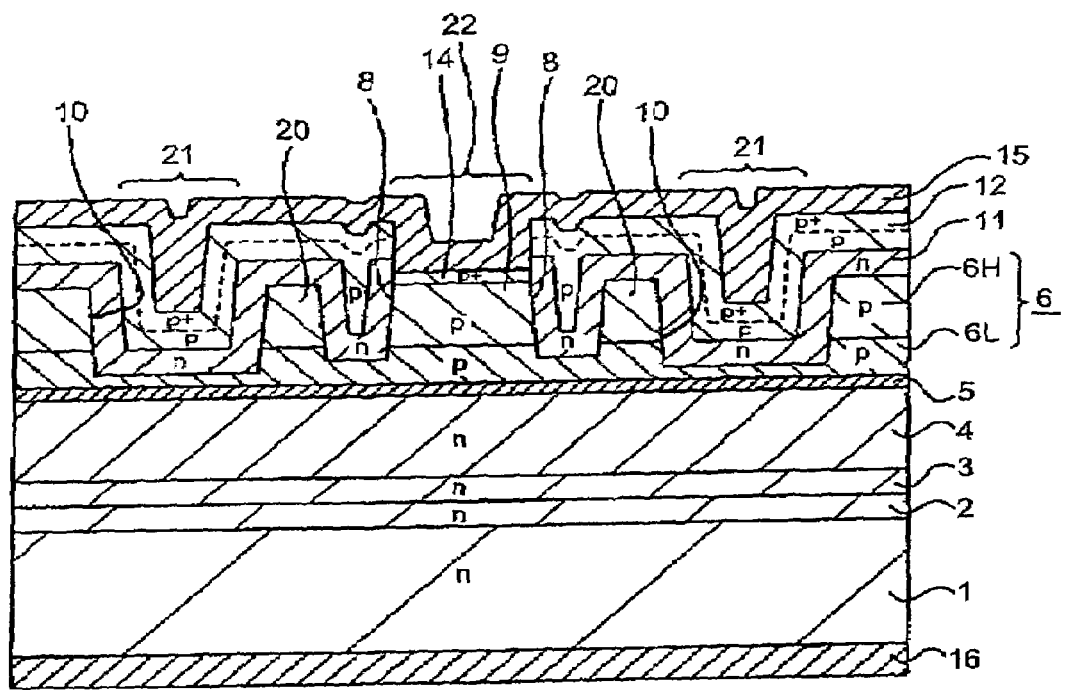
FIG. 1 is a schematic sectional view of one example of a semiconductor light emitting apparatus of the present invention.

The next paragraphs will describe a mode of embodiment of the semiconductor light emitting apparatus according to the present invention, referring to a schematic sectional view shown in FIG. 1. It is to be noted that the present invention is by no means limited to this mode of embodiment. The case exemplified herein relates to an AlGaAs-base semiconductor laser apparatus in a 780-nm band, and has, on a base 1 which is a first-conductivity-type or typically n-type GaAs substrate, an n-type first-conductivity-type or n-type buffer layer, which is expressed in the drawing as of double-layered typically comprising a GaAs second buffer layer 2 and an AlGaAs second buffer layer 3; a first-conductivity-type or n-type AlGaAs first cladding layer 4; an active layer 5 having a multiple quantum well (MQW) structure in which GaAs and AlGaAs are alternatively stacked; and a second cladding layer 6 in which a lower second cladding layer 6L and a high-concentration upper second cladding layer 6H, both of which being a second-conductivity-type or p-type, are stacked.

On the second cladding layer 6 side, there are provided a pair of ridge-forming grooves, for example, for configuring a pair of opposing first recesses 8 for forming a stripe-patterned ridge 9 which configures the main current path; and ridge-forming grooves, for example, for configuring the second recesses 10 formed on the outer side of at least one of the first recesses 8, and typically on the outer sides of both of them. Each of the first and second recesses 8, 10 is formed to a depth while keeping the active layer 5 unreached, wherein the recess 10 is typically formed to a depth so that it runs across the high-concentration upper second cladding layer 6H. By the procedures described in the above, stripe-patterned boundary ridges 20 are formed between the first recesses 8 and second recesses 10, so as to extend along the stripe-patterned ridge 9.

A first-conductivity-type or n-type current blocking layer 11 is then formed so as to extend over the inner surfaces of the first and second recesses 8, 10, and a second-conductivity-type or p-type contact layer 12 is formed further on the current blocking layer 11. This configuration makes it possible to form, in the active layer 5, the light emitting portion with the aid of current which flows through the major current path, and at the same time makes it possible to form PNPQN switching elements or thyristor structural portions 21 at the second recesses 10 by a stack arranged thereon and thereunder, wherein the stack comprises the second-conductivity-type or p-type contact layer 12; the first-conductivity-type or n-type current blocking layer 11; the second-conductivity-type or p-type cladding layers 6L and 6H; the active layer (Q) having a multiple quantum well structure; and the first cladding layer 4, the buffer layers 3 and 2, and the base 1, respectively having the first conductivity type or n-type conductivity. The ON voltage Von of the thyristor structural portion 21 is selectable through selection of the depth of the second recess 10, depending on impurity concentration and thickness of the current blocking layer 11, and on impurity concentration of the contact layer 12.

Figure 2:
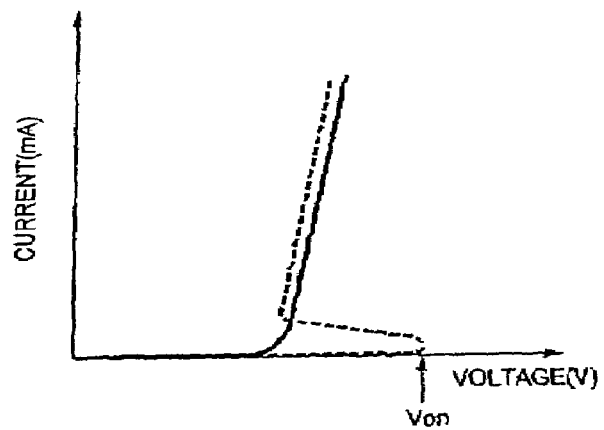
FIG. 2 is a current-voltage characteristic curve of the semiconductor light emitting element and the thyristor structural portion for explaining characteristics of the semiconductor light emitting apparatus of the present invention.

In thus-configured semiconductor light emitting apparatus of the present invention, the individual current-voltage characteristics of the intrinsic semiconductor light emitting element 22 having the major current path formed in the ridge 9 and the PNPQN structural portions are selected, as being respectively indicated by a solid line and a broken line in FIG. 2, so that the ON voltage $V_{on}$ of the thyristors is set close to the threshold voltage $V_{th}$ or operation voltage $V_{op}$ of the semiconductor light emitting element, so far as it does not interfere the operations of the semiconductor light emitting element. For an exemplary case where the operation voltage $V_{op}$ of the semiconductor light emitting element is 3 V, setting of $V_{on}$ to 4 V to 10 V or around, and setting of the operation voltage of the turned-on thyristor lower than or equivalent to the operation voltage $V_{op}$ of the semiconductor light emitting element make it possible to certainly prevent electrostatic destruction of the semiconductor light emitting element from occurring. In addition, area of the above-described thyristor structural portions is selected sufficiently larger than that of the major current path portion in the ridge 9.

Figure 3:
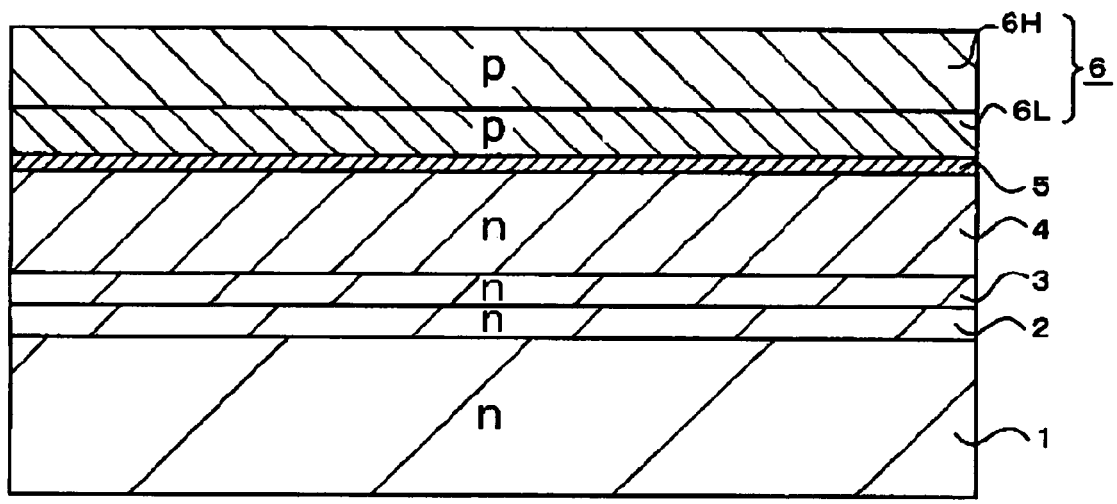
FIG. 3 is a schematic sectional view of an essential portion of the semiconductor light emitting apparatus in one process step of an exemplary method of fabricating the same according to the present invention.

Next paragraphs will explain one exemplary mode of embodiment of the method of fabricating a semiconductor light emitting apparatus according to the present invention, referring to process charts in FIG. 3 to FIG. 6. This example relates to a case of fabrication of the light-emitting semiconductor apparatus explained referring to FIG. 1, wherein first as shown in FIG. 3, the base 1, which is typically a first-conductivity-type or an n-type GaAs substrate, is obtained, and a first epitaxial growth process is carried out on the base 1, in which the first buffer layer 2 of 5000 Å thick for example composed of first-conductivity-type or n-type GaAs, the second buffer layer 3 of 5000 Å thick for example similarly composed of first-conductivity-type or n-type GaAs, the first cladding layer 4 of 2 µm thick for example composed of first-conductivity-type or n-type $Al_xGa_{1-x}As$, the active layer 5, the second cladding layer 6L of 4000 Å thick for example composed of second-conductivity-type or p-type $Al_xGa_{1-x}As$, and the high-impurity-concentration second cladding layer 6H of 1 µm thick for example composed of second-conductivity-type or p-type $Al_xGa_{1-x}As$ are sequentially stacked by epitaxial growth typically through the MOCVD (Metal Organic Chemical Vapor Deposition) process.

The active layer 5 can be configured, as described in the above, by the multiple quantum well structure (referred to as MQW, hereinafter) typically based on alternative stacking of AlGa layers and AlGaAs layers. In so-called SCH (Separate Confinement Heterostructure), guide layers are epitaxially grown on the upper side and lower side of the active layer 5 while placing it in between.

Figure 4:
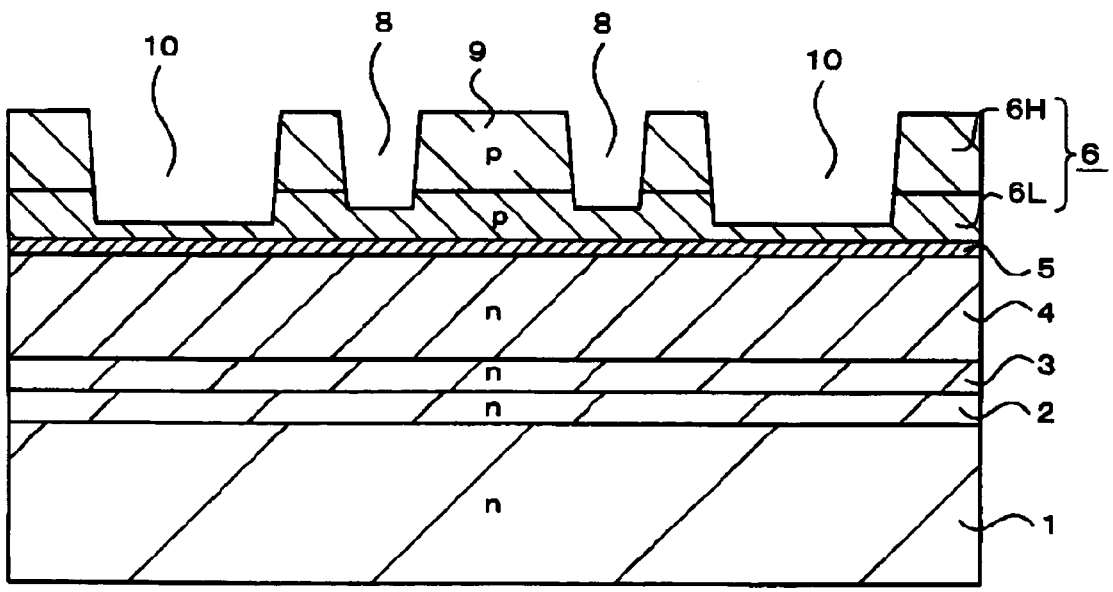
FIG. 4 is a schematic sectional view of an essential portion of the semiconductor light emitting apparatus in one process step of an exemplary method of fabricating the same according to the present invention.

Next, as shown in FIG. 4, a pair of first ridge-forming grooves 8 are formed by patterning-by-etching typically based on RIE (Reactive Ion Etching) through a mask formed by photolithography, to a depth across the high-concentration upper second cladding layer 6H and to as deep as the lower second cladding layer 6L having a lower impurity concentration than the clad layer 6H has, to thereby form the ridge 9 between the ridge-forming grooves 8. On the outer side of the ridge-forming grooves 8, a pair of second ridge-forming grooves 10 are formed along the first ridge-forming grooves 8, similarly by RIE for example. The depth of the second ridge-forming grooves 10 is configured that the lower second 5 cladding layer 6L is left by etching to the thickness of, for example, 20 nm. The width of the ridge-forming grooves 8 is preferably more than 10 µm, for example, 20 µm. It is necessary to consider the light distribution in the active layer 5 when there is a difference in the refractive index of the clad layers 6L, 6H, the current blocking layer 11, and the contact layer 12. And the width of the second ridge-forming grooves 10 is, for example, 100 µm so that it is enable to make the most of the lateral dimension of the semiconductor light emitting element. The distance between the first ridge-forming groove 8 and the second ridge-forming groove 10 is, for example, 20 µm.

Figure 5:
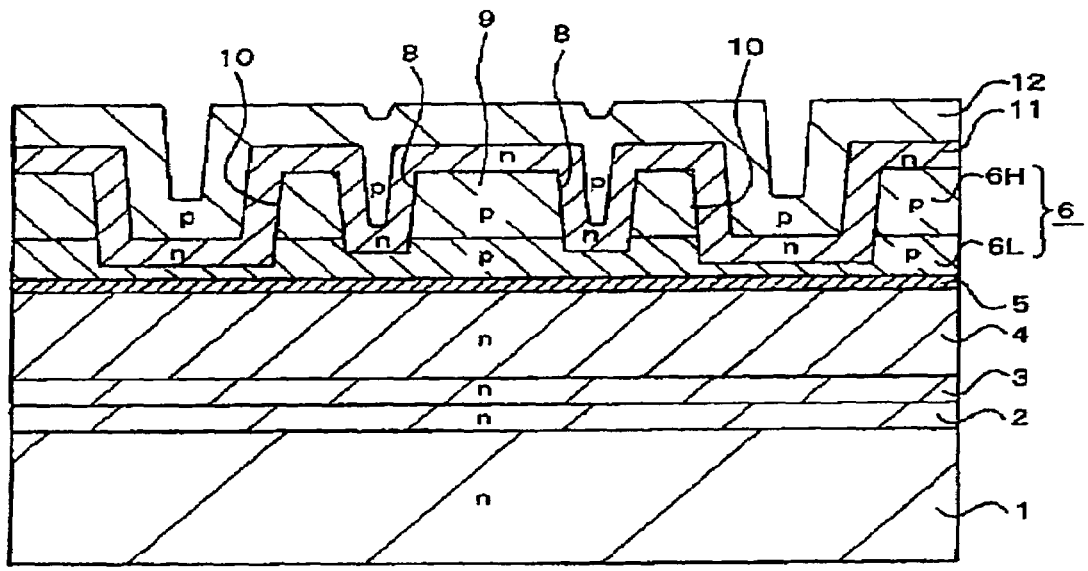
FIG. 5 is a schematic sectional view of an essential portion of the semiconductor light emitting apparatus in one process step of an exemplary method of fabricating the same according to the present invention.

As shown in FIG. 5, a second epitaxial growth process is carried out on the high-concentration second cladding layer 6H, in which the current blocking layer 11 of 6000 Å thick for example composed of first-conductivity-type or n-type AlGaAs of impurity concentration ranging from $10^{18}$ to $10^{19}$ $cm^{-3}$, and the contact layer 12 of 9000 Å thick for example composed of high-impurity-concentration or p-type GaAs of high impurity concentration ranging from $10^{19}$ to $10^{20}$ $cm^{-3}$ are sequentially grown through epitaxial growth typically by the MOCVD process, so as to extend over the inner surfaces of the ridge-forming grooves 8 and 10.

Figure 6:
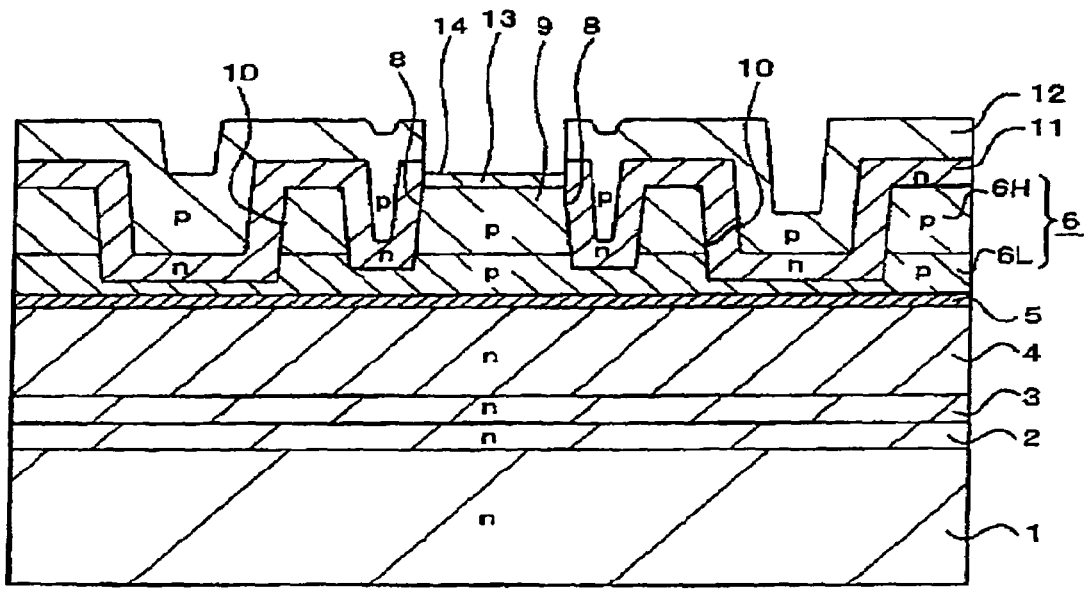
FIG. 6 is a schematic sectional view of an essential portion of the semiconductor light emitting apparatus in one process step of an exemplary method of fabricating the same according to the present invention.

Next, as shown in FIG. 6, a portion of the stack of the contact layer 12 and current blocking layer 11 on the ridge 9 is etched to a predetermined depth typically by patterning-by-etching based on RIE and photolithography, to thereby form the thinned portion 13. Thereafter, as 30 shown in FIG. 1, a second-conductivity-type or p-type impurity, which is typically Zn, is allowed to diffuse over the entire surface from the side above the contact layer 12 to as thick as 5000 Å for example, to thereby make the thinned portion 13 have a high-concentration second conductivity type or p-type, and to thereby form a contact layer 14. Next over the entire surface of the contact layers 14 and 12, a first electrode 15 composed of a Ti/Pt/Au stack is formed by deposition so as to form an ohmic contact, and on the back surface of the base 1, a second electrode 16 composed of an Au/Ni/Au stack is deposited so as to form an ohmic contact.

By the procedures described in the above, a desired semiconductor laser, that is, a semiconductor light emitting element, is formed in the ridge 9, and on both sides of the second recesses 10, the thyristor structural portions 21 are formed.

In the above-described fabrication method of the present invention, the recesses 10 are formed to a depth which should be determined by the thyristor structural-portion 21; or in other words, to a depth preliminarily designed so as to select the ON voltage $V_{on}$ of the thyristor, wherein the depth of the second recess 10 can be regulated by a method preliminarily forming a p-type etching stop layer, for example, showing a sufficiently small etchrate in the etching for forming the recesses 10, at a predetermined position of the recesses 10 in the above-described first epitaxial growth step, and typically in the epitaxial growth process of the cladding layer 6, to thereby facilitate control for termination of the etching. It is also allowable to adopt a method of controlling the etching time depending on the impurity concentration of the cladding layer 6, MQW structure of the active layer 5, and the impurity concentration of the current blocking layer 11.

It is to be noted that the semiconductor light emitting apparatus of the present invention is by no means limited to the case having only a single semiconductor light emitting element, but includes semiconductor light emitting elements of various configurations, such as those having a plurality of semiconductor light emitting elements, or such as those having a semiconductor light emitting element together with any other circuit elements to thereby configure an integrated circuit. Needless to say, it is also possible to obtain a large number of semiconductor light emitting apparatuses at the same time, by forming a large number of the semiconductor light emitting apparatuses on the base 1 at the same time, and by pelletizing.

The description in the above exemplified a semiconductor light emitting apparatus typically having an AlGaAs-base semiconductor laser of a 780-nm wavelength band used for CD (Compact Disc), but the present invention is also applicable, for example, to semiconductor light emitting apparatuses typically using semiconductor light emitting elements of 650-nm wavelength band used as a light source for DVD (Digital Versatile Disc), such as AlGaInP-base semiconductor laser. The present invention is by no means limited to the above-described examples, and allows various modifications and alterations without departing from the spirit thereof, and is applicable to a configuration in which light emitting elements having two or more different wavelengths, which are typically of 780-nm band and of 650-nm band, are formed as being arranged on a common base. The scope of the invention is indicated by the appended claims, rather than the foregoing description, and all changes that come within the meaning and range of equivalence thereof are intended to be embraced therein.

What is claimed is:

1. A semiconductor light emitting apparatus having a substrate, said apparatus comprising:
    an active layer located between a first-conductivity-type first cladding layer, and a second-conductivity-type second cladding layer on said substrate;
    a pair of opposing first recesses forming a stripe-patterned ridge which define a major current path formed over the active layer and extending into the second cladding layer, and a second recess disposed on the outer side of at least one of said first recesses, each of said first and second recesses being formed to a depth while keeping said active layer unreached;
    a first-conductivity-type current blocking layer formed so as to extend over the inner surfaces of said first and second recesses, and a second-conductivity-type contact layer formed over said current blocking layer;
    wherein a light emitting portion causing light emission is provided by current which flows through said major current path; and a thyristor structural portion is provided by a stack formed at said second recess comprising said second-conductivity-type contact layer, said first-conductivity-type current blocking layer, said second-conductivity-type cladding layer, said active layer and said first-conductivity-type first cladding layer.

2. The semiconductor light emitting apparatus according to claim 1,
    wherein said active layer can be configured as having a multiple quantum well (MQW) structure.

3. The semiconductor light emitting apparatus according to claim 1,
    wherein a stripe-patterned boundary ridge is formed between said first recess and said second recess, so as to extend along said stripe-patterned ridge.

4. The semiconductor light emitting apparatus according to claim 1,
    wherein said ON voltage of said thyristor is specifically adjusted to a low value not affective to operations of said semiconductor light emitting element.

5. The semiconductor light emitting apparatus according to claim 1,
    wherein operational voltage of said thyristor after turned on is adjusted to lower than, or equivalent to said operation voltage of said semiconductor light emitting element.

6. The semiconductor light emitting apparatus according to claim 1,
    wherein area of said thyristor structural portion is adjusted larger enough than area of said major current path portion.

7. The semiconductor light emitting apparatus of claim 1, wherein an ON voltage of said thyristor structural portion is adjustable depending on selection of depth of said second recess.

8. The semiconductor light emitting apparatus of claim 1, wherein the active layer extends beneath the first and second recesses.

9. A semiconductor light emitting apparatus having a substrate, said apparatus comprising: an active layer disposed between a first-conductivity-type first cladding layer and a second-conductivity-type second cladding layer;
    a pair of first recesses formed in said second cladding layer and defining a major current path, a second recess formed in said second cladding layer positioned on an outer side of said first recesses, wherein said active layer extends beneath said first and second recesses and said first and second recesses do not reach to the depth of said active layer;
    a first conductivity-type current blocking layer formed so as to extend over the inner surfaces of said first and second recesses;
    a second conductivity-type contact layer formed on said current blocking layer;
    a light emitting portion wherein current flowing through said major current path caused the emission of light by said light emitting portion;
    a thyristor structure formed at said second recess provided by said second conductivity-type contact layer, said first conductivity-type current blocking layer, said second-conductivity-type cladding layer, said active layer and said first-conductivity-type first cladding layer.

10. The semiconductor light emitting apparatus of claim 9, wherein an ON voltage of said thyristor sturctural portion is adjustable depending on selection of depth of said second recess.

11. The semiconductor light emitting apparatus of claim 9, wherein the active layer extends beneath the first and second recesses.

* * * * *